United States Patent
Anzai

(10) Patent No.: US 6,982,494 B2
(45) Date of Patent: Jan. 3, 2006

(54) SEMICONDUCTOR DEVICE WITH SIGNAL LINE HAVING DECREASED CHARACTERISTIC IMPEDANCE

(75) Inventor: Noritaka Anzai, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/631,723

(22) Filed: Aug. 1, 2003

(65) Prior Publication Data
US 2004/0026782 A1    Feb. 12, 2004

(30) Foreign Application Priority Data
Aug. 9, 2002    (JP)    ............... 2002-233762

(51) Int. Cl.
H01L 23/12    (2006.01)
(52) U.S. Cl. ............... 257/786; 257/737; 257/738; 257/734; 257/775; 257/776; 257/78; 257/781; 257/701; 257/728; 257/724; 257/773
(58) Field of Classification Search .............. 257/786, 257/737, 738, 734, 775, 776, 780, 781, 700, 257/701, 758, 275, 280, 724, 728, 773
See application file for complete search history.

(56) References Cited

U.S. PATENT DOCUMENTS

| | | | | |
|---|---|---|---|---|
| 4,948,754 | A | * | 8/1990 | Kondo et al. ............... 438/613 |
| 5,604,379 | A | * | 2/1997 | Mori ........................ 257/738 |
| 5,719,449 | A | * | 2/1998 | Strauss ...................... 257/786 |
| 5,834,844 | A | * | 11/1998 | Akagawa et al. ............ 257/734 |
| 6,111,317 | A | * | 8/2000 | Okada et al. ................ 257/737 |
| 6,153,448 | A | * | 11/2000 | Takahashi et al. .......... 438/114 |
| 6,200,888 | B1 | * | 3/2001 | Ito et al. .................... 438/597 |
| 6,225,143 | B1 | * | 5/2001 | Rao et al. ................... 438/106 |
| 6,333,565 | B1 | * | 12/2001 | Hashimoto ................. 257/781 |
| 6,437,428 | B1 | * | 8/2002 | Fujisawa et al. ............ 257/666 |
| 6,437,432 | B2 | | 8/2002 | Ikumo et al. |
| 6,455,880 | B1 | * | 9/2002 | Ono et al. .................. 257/275 |
| 6,538,316 | B2 | * | 3/2003 | Maetani ...................... 257/700 |
| 6,639,315 | B2 | * | 10/2003 | Kazama et al. ............. 257/738 |
| 6,680,544 | B2 | * | 1/2004 | Lu et al. ..................... 257/786 |
| 6,750,135 | B2 | * | 6/2004 | Elenius et al. .............. 438/615 |
| 6,770,547 | B1 | * | 8/2004 | Inoue et al. ................. 438/496 |

(Continued)

FOREIGN PATENT DOCUMENTS

JP    2001-118957    4/2001

(Continued)

*Primary Examiner*—Alexander Oscar Williams
(74) *Attorney, Agent, or Firm*—Volentine Francos & Whitt, PLLC

(57) ABSTRACT

A semiconductor device includes a semiconductor chip, electrodes pads, an insulating layer, first and second conductive patterns and external terminals. The electrode pads are formed on a first area of a main surface of the semiconductor chip. The insulating layer is formed on a second area of the semiconductor chip so as to expose the electrode pads. The first conductive patterns provide a ground potential and are formed on the insulating layer. The second conductive pattern transfers a signal. The second conductive pattern is formed on the insulating layer and located between the first conductive patterns. The external terminals are formed on the first and second patterns at the second area.

26 Claims, 9 Drawing Sheets

U.S. PATENT DOCUMENTS

| | | |
|---|---|---|
| 6,784,557 B2 * | 8/2004 | Nakamura et al. .......... 257/784 |
| 2002/0063332 A1 | 5/2002 | Yamaguchi et al. |
| 2003/0218246 A1 * | 11/2003 | Abe et al. ................... 257/734 |
| 2004/0017008 A1 * | 1/2004 | Ueda .......................... 257/734 |
| 2004/0108595 A1 * | 6/2004 | Shen .......................... 257/737 |
| 2004/0173794 A1 * | 9/2004 | Yu et al. ...................... 257/48 |
| 2004/0183205 A1 * | 9/2004 | Yamaguchi ................. 257/774 |

FOREIGN PATENT DOCUMENTS

| | | |
|---|---|---|
| JP | 2001-267350 | 9/2001 |
| JP | 2002-93947 | 3/2002 |

* cited by examiner

SEMICONDUCTOR DEVICE WITH SIGNAL LINE HAVING DECREASED CHARACTERISTIC IMPEDANCE

BACKGROUND OF THE INVENTION

1. Field of the Invention

The present invention relates to a semiconductor device having a package structure, and more particularly, relates to a semiconductor device having a WCSP type structure.

2. Description of the Background Art

The high integration of a semiconductor device mounted in an electronic device and the high frequency of a transmission signal have been expected increasingly in recent years. A CSP (Chip Size Package) serving as a semiconductor, which is packaged in an outline size substantially same as that of a semiconductor chip, has been proposed to cope with this expectation.

In recent years, with a view of decreasing a manufacturing cost or the like, a technical development of a WCSP (Wafer-level Chip Size Package) has been promoted. The WCSP comprises a CSP, in which its external terminal formation process is completed in a waferlevel and is individualized by dicing.

In this WCSP, there is known, as one example thereof, one having a structure such that an electrode pad and an external terminal, which are mounted on a semiconductor chip, are electrically connected via a wiring layer (a rewiring layer) for rearranging this external terminal in a desired position.

In the WCSP having the above described rewiring layer, a degree of freedom in a wire design may be improved due to the rewiring layer.

In the case of transmitting a high frequency signal by the use of the above described WCSP having the rewiring layer, it is desirable that, between a circuit element, which is provided to a semiconductor chip, and a signal line, namely, a rewiring layer to be electrically connected to the foregoing circuit element via an electrode pad, impedance of the both is matched.

By avoiding mismatch between the circuit element and the signal line, attenuation of the transmission signal arising from the reflection or the like of the transmission signal generated in the vicinity of a joint between the electrode pad and the signal line can be restrained.

However, regardless of that a characteristic impedance of the signal line in the WCSP is sufficiently larger than the impedance of the circuit element, an effective method has not been proposed to match the impedance between both by decreasing the characteristic impedance of the signal line.

SUMMARY OF THE INVENTION

A semiconductor device of the present invention includes a semiconductor chip, electrodes pads, an insulating layer, first and second conductive patterns and external terminals. The electrode pads are formed on a first area of a main surface of the semiconductor chip. The insulating layer is formed on a second area of the semiconductor chip so as to expose the electrode pads. The first conductive patterns provide a ground potential and are formed on the insulating layer. The second conductive pattern transfers a signal. The second conductive pattern is formed on the insulating layer and located between the first conductive patterns. The external terminals are formed on the first and second patterns at the second area.

DESCRIPTION OF THE PREFERRED EMBODIMENTS

Figure 1:
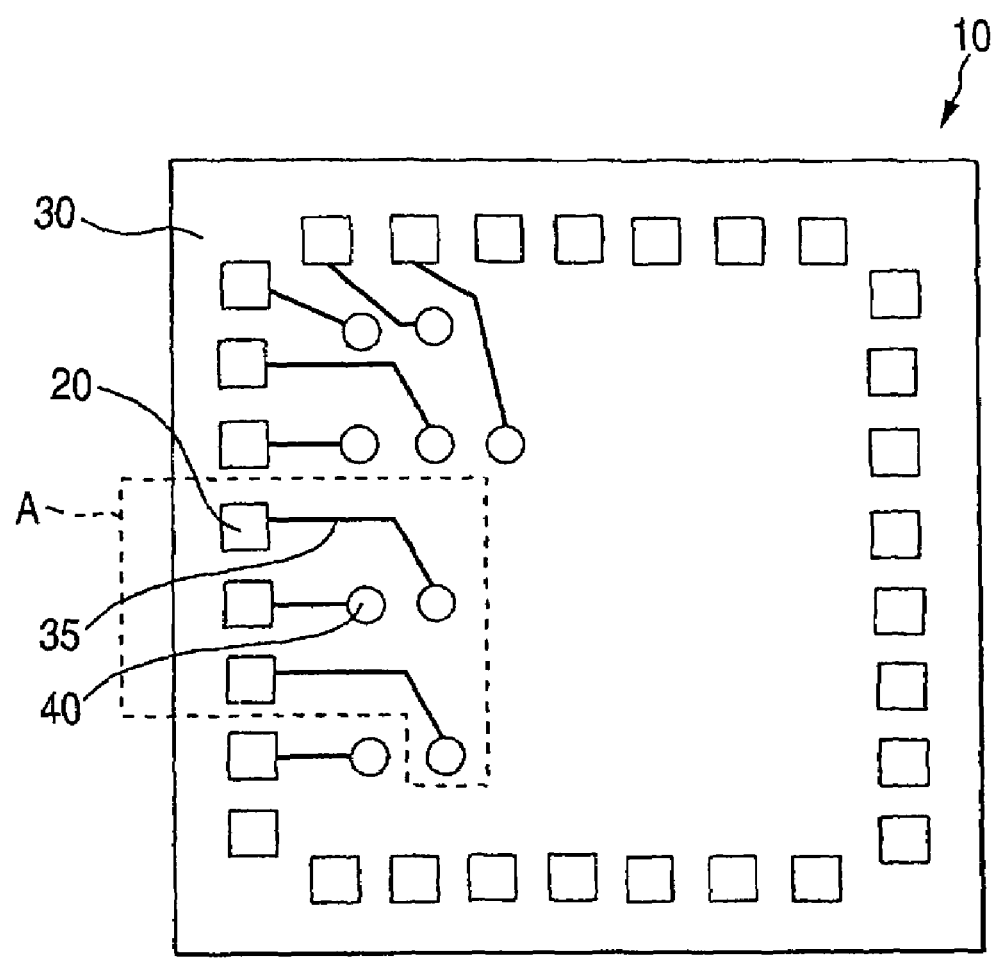
FIG. 1 is a schematic plane view for showing a semiconductor device of a first embodiment according to the present invention.

With reference to FIGS. 1 to 9, the embodiments according to the present invention will be described below. Further, each drawing schematically illustrates a constitutional example of the semiconductor device according to the present invention. In addition, in each drawing, a shape, a size and an arrangement of each constitutional component are only schematically illustrated so as to allow the present invention to be understood, but the present invention is not limited to the examples shown in the drawings. In addition, in order to make the drawings understandable, hatching (i.e., a diagonal line) is omitted except for a part thereof. Further, in the following descriptions, a particular material and a particular condition or the like are used, however, these material and condition are merely preferable examples. Accordingly, the present invention is not limited to these. In addition, in each drawing, with respect to the identical parts, the identical reference numerals are given and the explanations thereof may be omitted.

In addition, according to each embodiment to be described below, an individual CSP obtained by cutting the CSP in a waferlevel by means of dicing is referred to as a WCSP, and the present invention will be described with taking this WCSP as an example of the semiconductor device.

[First Embodiment]

Figure 2A:
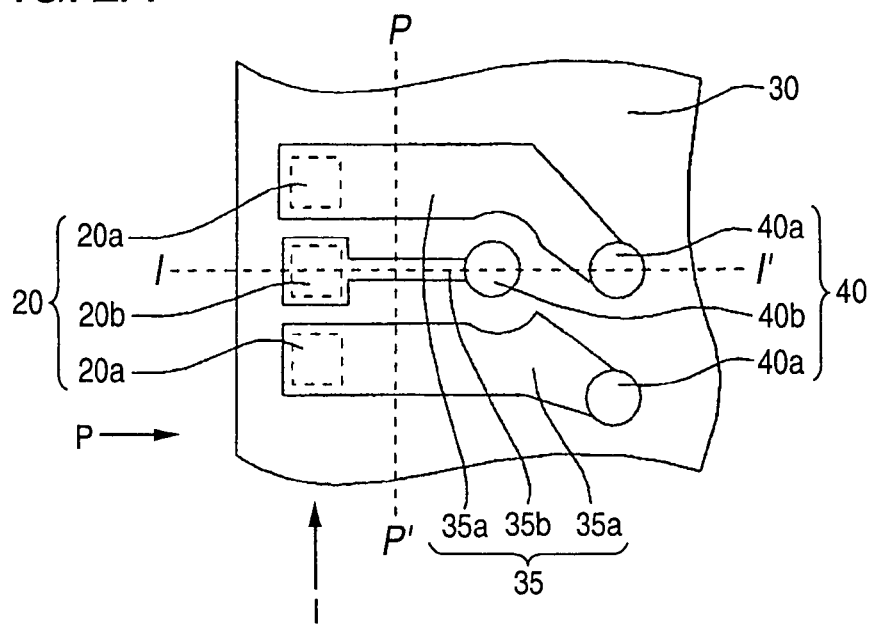
FIGS. 2A to 2C are a schematic plane view and a schematic cross sectional view for showing partially the semiconductor device of the first embodiment according to the present invention.

With reference to FIG. 1 and FIGS. 2A to C, a semiconductor device of the first embodiment according to the present invention will be described below. FIG. 1 is a plane view for showing schematically a WCSP 10, which is the semiconductor device of the present embodiment. In addition, FIG. 2A illustrates each constitutional element in detail as enlarging an A region, which is encircled by a broken line in the plane view shown in FIG. 1 (hereinafter, in each embodiment, the drawings corresponding to FIG. 1 are omitted and the description will be provided with reference to the drawings corresponding to this enlarged schematic view). In addition, in FIG. 2B, a cut area (a cross section) to be acquired by cutting FIG. 2A along a broken line I–I' is seen from an arrow I direction in FIG. 2A. Further, in FIG. 2C, a cut area (across section) to be acquired by cutting FIG. 2A a long a broken line P–P' is seen from a narrow P direction in FIG. 2A (the same is applied to the following respective embodiments). Further, in FIG. 1 and FIG. 2A, for convenience, the illustration of a sealing membrane 50 such as an organic resin membrane or the like, which is provided to the WCSP 10, is omitted, and in FIG. 1, the illustration of a wiring layer 35 and a post portion 40 are also partially omitted.

On a semiconductor chip 15, which is provided to the WCSP 10 serving as the semiconductor device, electrode pads 20 made of aluminum (Al) are arranged at a regular interval along an outer circumference of the semiconductor chip 15. According to the example shown in FIG. 1, a shape in plain view of the WCSP 10 is square, so that the electrode pads 20 are linearly arranged along the respective side of the square. In addition, the number and the position of the electrode pads 20 are not limited to this, and for example, only one set of the electrode pads 20 is arranged on the semiconductor chip 15, where each thereof is opposed with each other.

Figure 2B:
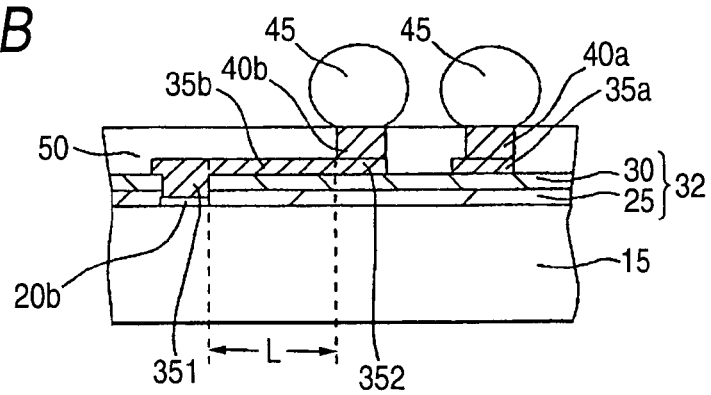

In addition, as shown in FIGS. 2A and 2B, on the semiconductor chip 15 provided with the circuit element, insulating layers (this insulating layer is also referred to as a first insulating layer) 32 such as a passivation membrane 25 and a protection membrane 30, are sequentially disposed so as to expose the surfaces of these electrode pads 20. Further, for example, the passivation membrane 25 is formed by a silicon oxide film ($SiO_2$), and the protection membrane 30 is formed by a membrane material with a low degree of hardness such as a polyimide resin, so that it is possible to restrain the shock against the semiconductor chip 15 during manufacturing and the abruption of the insulating layers due to the stress between a sealing membrane 50 and the semiconductor chip 15.

Further, as shown in FIG. 2A, respective electrode pads 20 (20a, 20b) are electrically connected to corresponding respective post portions 40 (40a, 40b) individually via respective dedicated wiring layers 35 (35a, 35b). This wiring layer 35 is elongated on the protection layer 30 in a center direction of the semiconductor chip 15 and is formed by a copper (Cu).

More in detail, each of wiring layers 35 according to the present embodiment is connected to the electrode pad 20 corresponding to this wiring layers 35, and further, the post portion 40 is formed on a surface elongated on a first insulating layer 32 among respective wiring layers 35.

Thus, by this wiring layer 35, a solder ball (bump) (not illustrated), which is formed on this post portion 40 serving as an external terminal for connection to a mounting substrate, is capable of being disposed on a desirable position on a substantially horizontal plane, namely, a position at the upper side of the semiconductor chip 15 shifted from a right above position of the electrode pad 20 without depending on the position of the electrode pad 20. Accordingly, this wiring layer 35 functions as a rewiring layer, which enables rearrangement of the external terminal (hereinafter, the wiring layer 35 may be referred to as the rewiring layer).

Figure 2C:
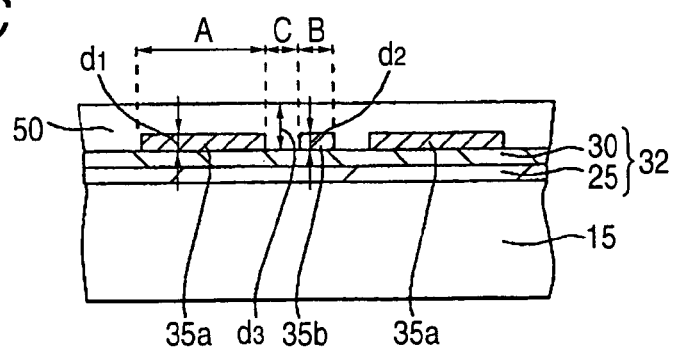

In addition, as shown in FIGS. 2B and 2C, on the upper face side of the semiconductor chip 15, the sealing membrane 50 such as an epoxy resin is formed so as to cover the passivation membrane 25 and the protection membrane 30 or the like and to expose the surface of the post portion (40a, 40b). Then, this post portion (40a, 40b) is connected to a solder ball 45 serving as the external terminal as a bump for connection to a print substrate (not illustrated).

According to a connection structure of the wiring layer 35 shown in FIG. 2A, by each of two first wiring layers 35a, the connection between the first electrode pads 20a and the first post portions 40a is formed, respectively. Further, by the second wiring layer 35b, the connection between the second electrode pad 20b and the second post portion 40b is formed. The first wiring layers 35a are also referred to as a GND wire or a GND layer since the grounding (GND) voltage is supplied thereto. In addition, the second wiring layer is also referred to as a signal line or a signal layer since an electric signal having a voltage based on the grounding (GND) voltage, namely, a high frequency signal (a variable potential signal) is supplied thereto. Further, the high frequency in this constitutional example means a frequency of a signal transmitted through the signal line having a length that is not so short with respect to an effective wave length of the operational frequency of the semiconductor chip.

In this case, between a pair of first wiring layers 35a, the second wiring layer 35b is placed on the upper surface of the protection membrane 30 so that the second wiring layer 35b does not contact each of the first wiring layers 35a with each other.

In this way, the connection structure of these wiring layers shown in FIG. 2A comprises a coplanar line structure, in which the second wiring layer is placed with being sandwiched by two first wiring layers from the opposite sides thereof, when the first and second wiring layers are viewed two-dimensionally.

In this coplanar line structure, the signal line 35b is sandwiched by the GND wire 35a, so that the electromagnetic bond between the GND wire 35a and the signal line 35b is enhanced. As a result, a capacity between the GND wire 35a and the signal line 35b is increased and the impedance of the signal line is decreased, so that it is possible to decrease the characteristic impedance of the signal line 35b as compared to a conventional case.

Therefore, the inventor of the present invention has a knowledge that the characteristic impedance to be decreased of this signal line 35b and the impedance of the circuit element may be matched particularly by considering the arranging position of the GND wire 35a as the rewiring layer.

It is possible to match the characteristic impedance of this signal line 35b with the impedance of the circuit element mainly by adjusting a width of the GND wire 35a (represented by A in FIG. 2C), a width of the signal line 35b (represented by B in FIG. 2C), a thickness of the GND wire 35a (represented by $d_1$ in FIG. 2C), a thickness of the signal line 35b (represented by $d_2$ in FIG. 2C), a horizontal spacing between the GND wire 35a and the signal line 35b (represented by C in FIG. 2C), an electric resistivity $\rho$ of the wiring layer 35 (here, a copper (Cu) is used as a formation material of the wiring layer 35), a dielectric constant $\in$ (here, the dielectric constant ∈ of an epoxy resin 50 between the signal line 35b and the GND wire 35a, which has a considerable impact on the characteristic impedance of the signal line 35b) of a dielectric layer around a conductive part (the wiring layer 35, the electrode pad 20, the post portion 40) on the semiconductor chip 15, and a thickness (represented by $d_3$ in FIG. 2C) of a dielectric layer around the conductive part (here, the epoxy resin 50). Further, it is preferable that transmission efficiency is also considered when the formation material of the wiring layer 35 is a magnetic body.

According to the constitutional example shown in FIGS. 2A to 2C, the first and second electrode pads 20a, 20b, and 20a are linearly placed in parallel and respective wiring layers 35a, 35b, and 35a are linearly elongated from right above the electrode pad to respective post portions 40a, 40b, and 40a in a direction orthogonal to the arranging direction of these electrode pads. Accordingly, in this case, the width of the signal line 35b (represented by B in FIG. 2C) indicates the width of a signal line portion (a portion represented by L in FIG. 2B) in the signal line 35b between a contact portion 351 with the second electrode pad 20b (refer to FIG. 2B) and a contact portion 352 with the external terminal 40b (refer to FIG. 2B) in the arranging direction of the electrode pads, when this constitutional example is seen two-dimensionally in FIG. 2A. In the same way, the width of the GND wire 35a (represented by A in FIG. 2C) indicates the width of the GND wire portion corresponding to L in FIG. 2B in the arranging direction of the electrode pads.

Therefore, for example, in the case of making the characteristic impedance of the signal line 35b about 50 [Ω], which is nearly equal to the impedance of the circuit element provided to the semiconductor chip 15, the characteristic impedance of the signal line 35b may be set so that, for example, A=200 [µm], B=40 [µm], $d_1$=5 [µm], $d_2$=5 [µm], C=23 [µm], ρ=1.67×10$^{-6}$ [Ωcm (20° C.)], and ∈≅4 [F/m] and $d_3$=90 [µm] are established.

In this way, the width of each of the GND wire and the signal line and the spacing between the GND wire and the signal line depend on the electric resistivity of the formation materials of the GND wire and the signal line and the dielectric constant of the dielectric layer filled in the gap between the GND wire and the signal line.

According to the above described setting conditions, the characteristic impedance of the signal line 35b can be made about 50 [Ω]. Accordingly, it is possible to get rid of a mismatch of the impedance between the signal line 35b and the circuit element provided to the semiconductor chip 15.

In other words, according to the present embodiment, a function to decrease the characteristic impedance of the signal line is further added to the wiring layer, which has been provided for rearranging the external terminal so far.

As being apparent from the above descriptions, according to the present embodiment, matching of the characteristic impedance of the signal line 35b and the impedance of the circuit element provided to the semiconductor chip 15 is realized.

Therefore, the transmission of the high frequency signal can be effectively realized, so that it is possible to obtain a semiconductor device having the high frequency property, which is superior to the conventional one.

[Second Embodiment]

With reference to FIG. 3, a semiconductor device of the second embodiment according to the present invention will be described below.

The present embodiment is different from the first embodiment mainly in that the width of the GND wire 35a (=A) and the spacing (=C) between the GND wire 35a and the signal line 35b are set to be narrower as compared to the first embodiment. In addition, with respect to the constitutional elements, which are identical to those described in the first embodiment, the identical reference numerals are given and the specific explanations thereof may be omitted (the same is applied to the following respective embodiments).

On the upper part of the semiconductor chip 15, to which the high frequency signal is transmitted, for example, passive elements such as a coil and a capacitor are formed (not illustrated). Such passive elements come under the influence of an electromagnetic field to be radiated when the current is applied to the post portion 40 and the wiring layer 35, so that the operation of an integrated circuit provided to the semiconductor chip 15 may get unstable.

Figure 3A:
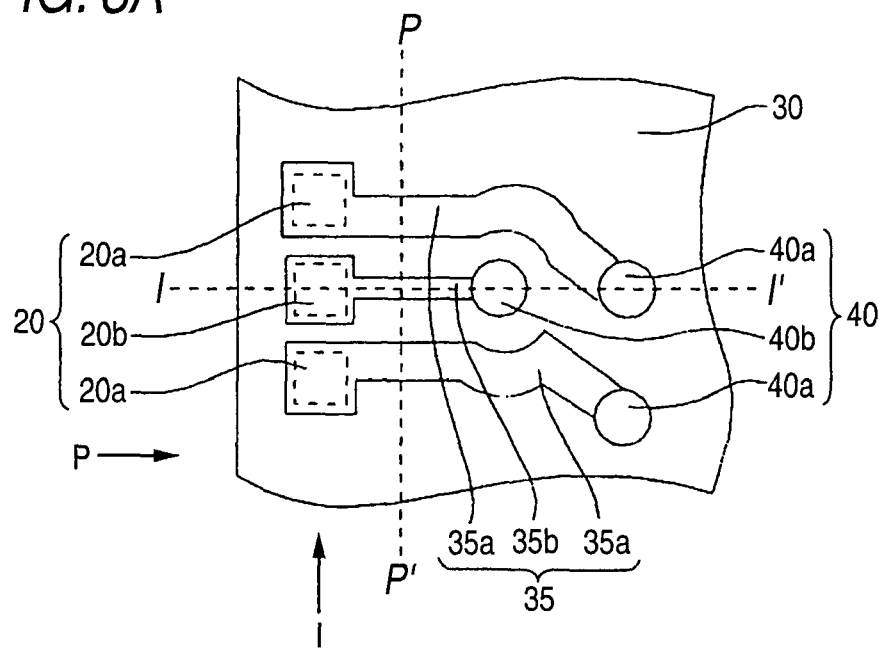
FIGS. 3A to 3C are a schematic plane view and a schematic cross sectional view for showing partially the semiconductor device of a second embodiment according to the present invention.
Figure 3B:
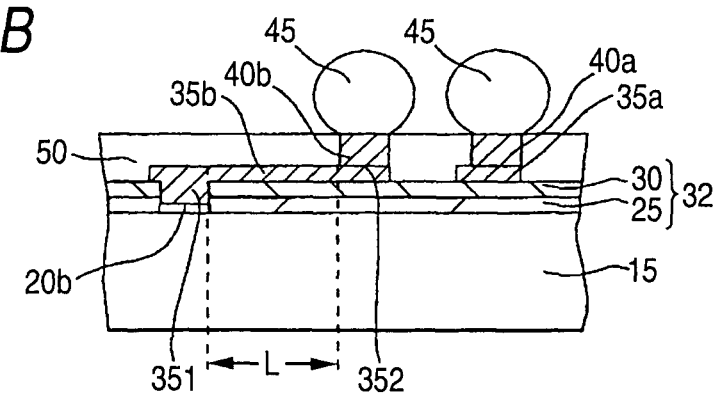
Figure 3C:
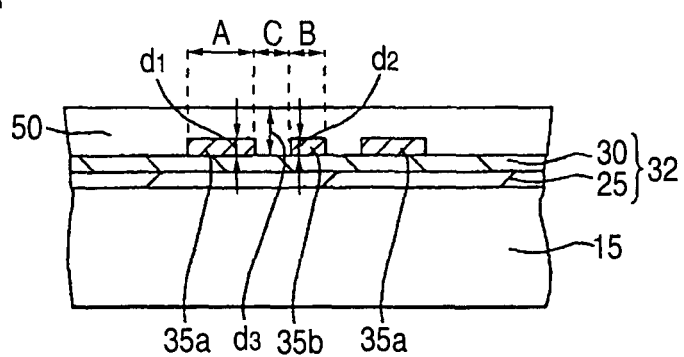

Therefore, as shown in FIGS. 3A to 3C, according to the present embodiment, in the rewiring layer according to the first embodiment, the width of the signal line 35b (=B) and the spacing (=C) between the GND wire 35a and the signal line 35b are the same or nearly same as the case of the first embodiment, however, the width of the GND wire 35a (=A), which was considerably wider than that of the signal line 35b (=B), is set to be narrower.

However, when the width of the GND wire 35a (=A) is narrower, the electromagnetic bond between the GND wire 35a and the signal line 35b is weaken. Accordingly, an electric charge capacity between the GND wire 35a and the signal line 35b is decreased, so that the inductance is increased.

As a result, since the characteristic impedance of the signal line is a square root of a value obtained by dividing the inductance by the capacity, the characteristic impedance of the signal line 35b is increased by making the width of the GND wire 35a (=A) narrower.

Therefore, according to the present embodiment, by setting the spacing (=C) between the GND wire 35a and the signal line 35b to be narrower as compared to the first embodiment, increase in the characteristic impedance of the signal line 35b is restrained.

Therefore, in the case of making the characteristic impedance of the signal line 35b about 50 [Ω], which is nearly equal to the impedance of the circuit element provided to the semiconductor chip 15, the characteristic impedance of the signal line 35b may be set so that, for example, A=100 µm, B=40 [µm], $d_1$=5 [µm], $d_2$=5 [µm], C=22 [µm], ρ=1.67×10$^{-6}$ [Ωcm (20° C.)], and ∈≅4 [F/m] and $d_3$=90 [µm] are established.

According to the above described setting conditions, it is possible to get rid of a mismatch of the impedance between the signal line 35b and the circuit element provided to the semiconductor chip 15.

As being apparent from the above description, it is possible to obtain the same advantage as the first embodiment.

Further, according to the present embodiment, the undesirable mutual interaction between the GND wire 35a serving as the rewiring layer and the integrated circuit provided to the semiconductor chip 15 is restrained, so that the semiconductor device having a higher reliability can be obtained.

[Third Embodiment]

Figure 4A:
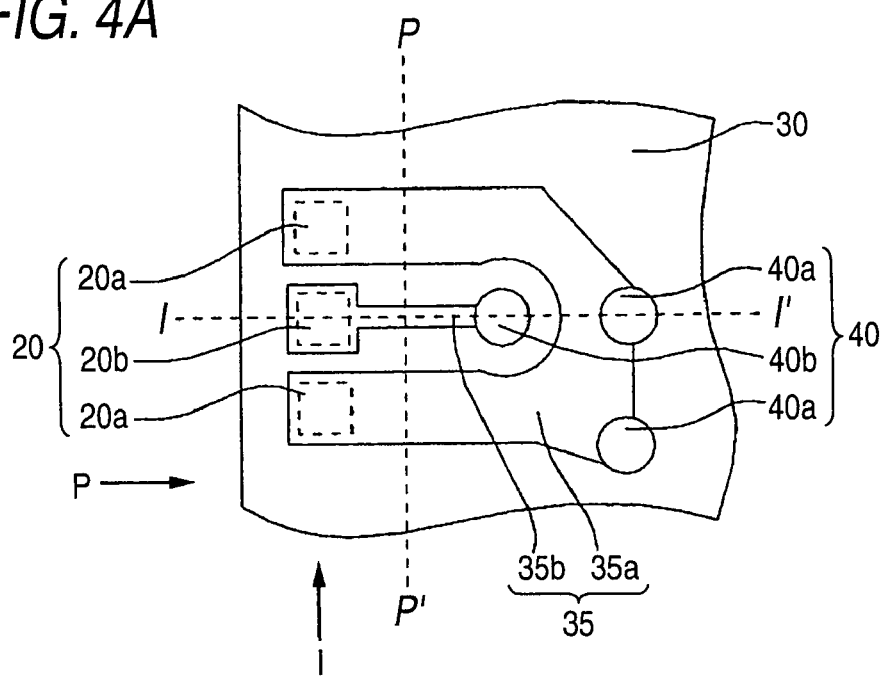
FIGS. 4A to 4C are a schematic plane view and a schematic cross sectional view for showing partially the semiconductor device of a third embodiment according to the present invention.
Figure 4B:
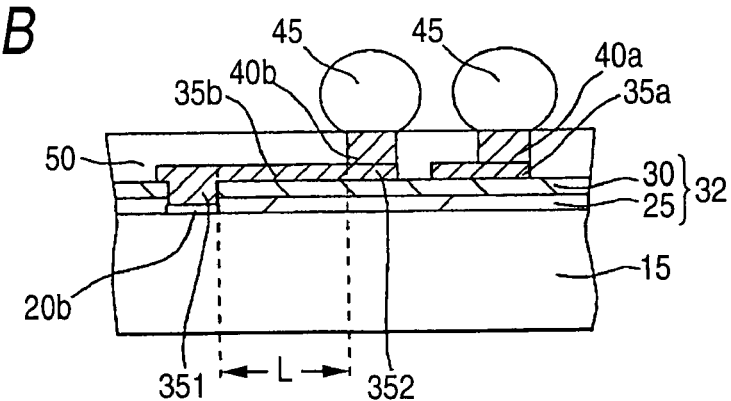
Figure 4C:
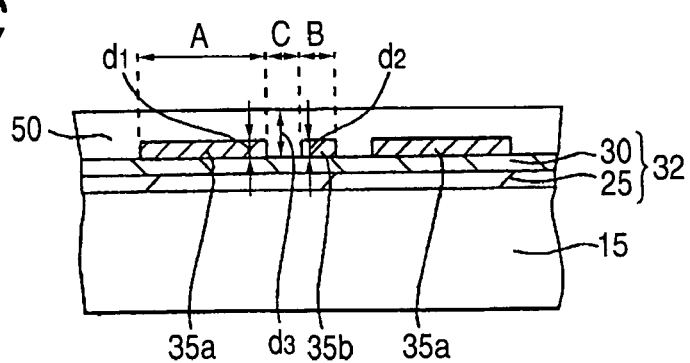

With reference to FIGS. 4A to 4C, a semiconductor device according to the third embodiment of the present invention will be described below.

The present embodiment is different from the first embodiment in that two GND wires 35a are placed so as to encircle the signal line 35b.

In order to further decrease the transmission loss of the high frequency signal, to say nothing of the characteristic impedance of the signal line 35b, it is preferable that the characteristic impedance of each constitutional element of a conductive part formed on the semiconductor chip 15 (for example, the electrode pad 20, the post portion 40 and the solder ball (external terminal) 45 or the like) is matched with the impedance of the circuit element.

Therefore, according to the present embodiment, as shown in FIG. 4A, in a planar arrangement, the sides, which are not connected to the first electrode pad 20a of two GND wires 35a sandwiching the signal line 35b from the opposite sides thereof, namely, the terminals at the sides to be connected to the first post portions 40a are coupled so as to encircle the signal line 35b and the second post portion 40b to be connected to the signal line 35b, so that a bond wiring layer is formed.

Therefore, for example, in the case of making the characteristic impedance of the signal line 35b about 50 [Ω], which is nearly equal to the impedance of the circuit element provided to the semiconductor chip 15, for example, as in the first embodiment, a setting condition of each portion is determined (refer to FIG. 4C) and further, the GND wire 35a is integrally formed in a U character extending from one electrode pad 20a to other electrode pad 20a. Then, this GND wire 35a encircles the signal line 35b and the second post portion 40b to be connected to this signal line 35b in a U character. In addition, each first post portion 40a is capable of being connected to the U-shaped GND wire 35a in the midstream thereof.

As a result, as shown in FIGS. 4A and 4B, as compared to the first embodiment, the GND wire 35a is widely arranged in the vicinity of the second post portion 40b to be connected to the signal wire 35b.

In this way, by conforming the width of each of the GND wire 35a and the signal line 35b and the spacing between the GND wire 35a and the signal line 35b to the above described setting conditions, it is possible to get rid of a mismatch of the impedance between the signal line 35b and the circuit element provided to the semiconductor chip 15.

As being apparent from the above description, according to the present embodiment, it is possible to obtain the same advantage as that of the first embodiment.

Further, according to the present embodiment, as compared to the first embodiment, the characteristic impedance of the post portion 40 is decreased, so that the semiconductor device having a higher reliability can be obtained, which enables the transmission loss of the high frequency signal to be further restrained.

[Fourth Embodiment]

Figure 5A:
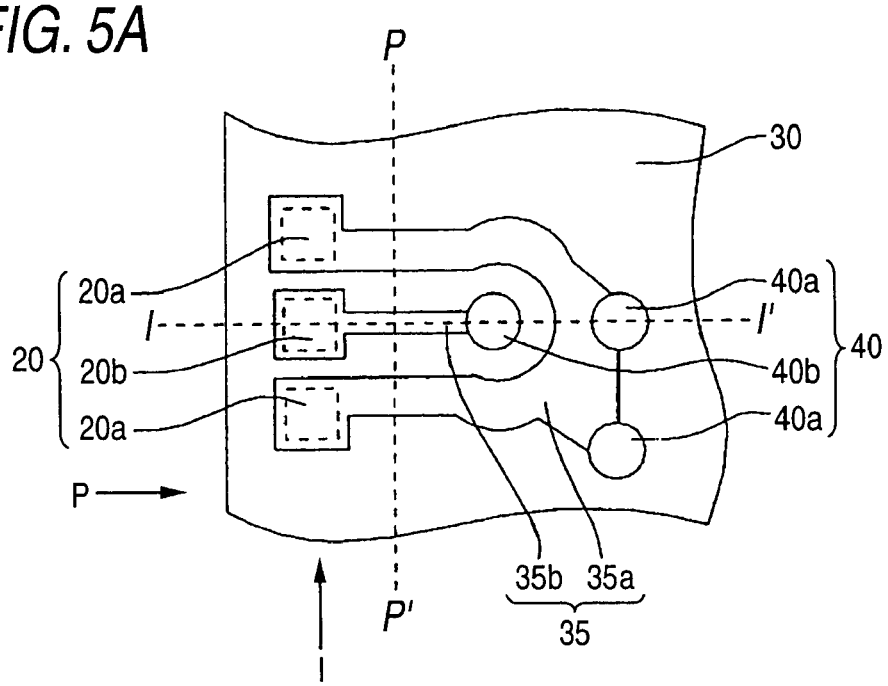
FIGS. 5A to 5C are a schematic plane view and a schematic cross sectional view for showing partially the semiconductor device of a fourth embodiment according to the present invention.
Figure 5B:
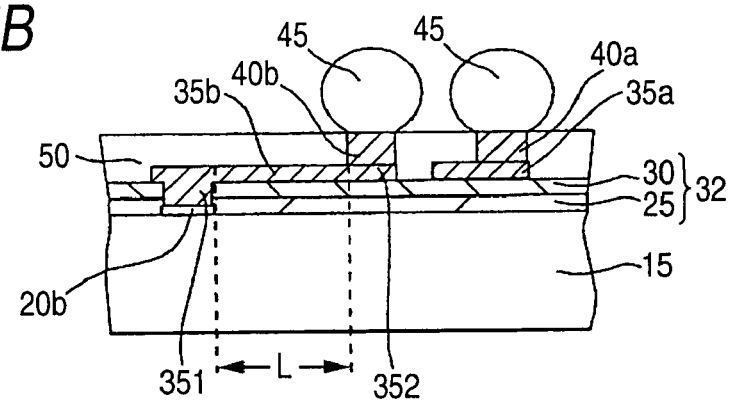
Figure 5C:
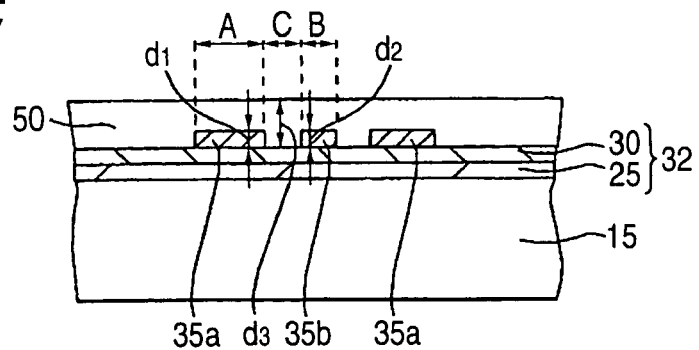

With reference to FIGS. 5A to 5C, a semiconductor device according to the forth embodiment of the present invention will be described below.

The present embodiment is different from the second embodiment mainly in that the GND wire 35a is provided so as to encircle the signal line 35b as same as the third embodiment.

Therefore, for example, in the case of making the characteristic impedance of the signal line 35b about 50 [Ω], which is nearly equal to the impedance of the circuit element provided to the semiconductor chip 15, for example, as the second embodiment, a setting condition of each portion is determined (refer to FIG. 5C) and further, the GND wire 35a is integrally formed in a U character extending from one electrode pad 20a to other electrode pad 20a. Then, this GND wire 35a encircles the signal line 35b and the second post portion 40b to be connected to this signal line 35b in a U character. In addition, each first post portion 40a is capable of being connected to the U-shaped GND wire 35a in the midstream thereof.

As a result, as shown in FIGS. 5A and 5B, as compared to the second embodiment, the GND wire 35a is widely arranged in the vicinity of the second post portion 40b to be connected to the signal wire 35b.

In this way, by conforming the width of each of the GND wire 35a and the signal line 35b and the spacing between the GND wire 35a and the signal line 35b to the above described setting conditions, it is possible to get rid of a mismatch of the impedance between the signal line 35b and the circuit element provided to the semiconductor chip 15.

As being apparent from the above description, according to the present embodiment, it is possible to obtain the same advantage as that of the second embodiment.

Further, according to the present embodiment, as compared to the second embodiment, the characteristic impedance of the post portion 40 is decreased, so that the semiconductor device having a higher reliability can be obtained, which enables the transmission loss of the high frequency signal to be further restrained.

[Fifth Embodiment]

Figure 6A:
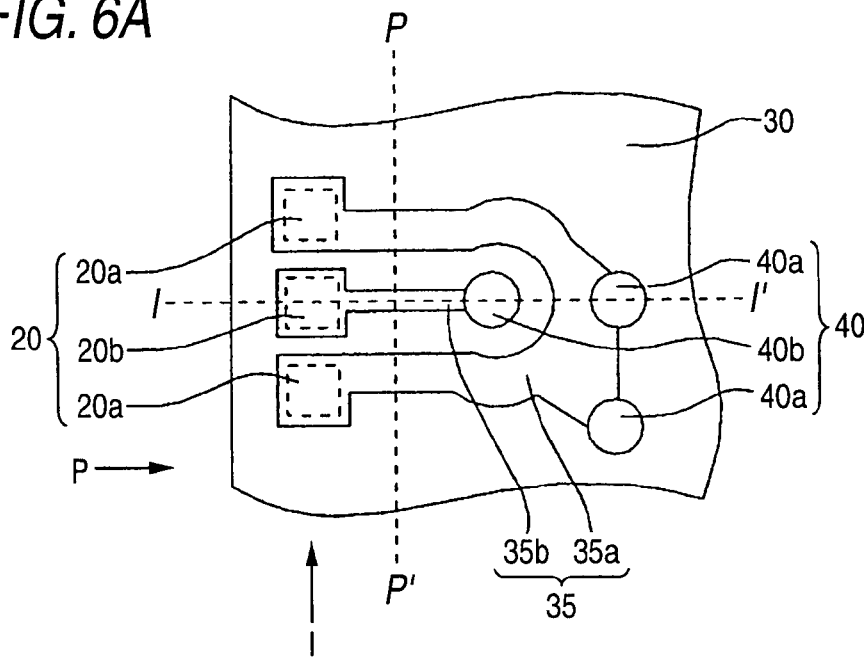
FIGS. 6A to 6C are a schematic plane view and a schematic cross sectional view for showing partially the semiconductor device of a fifth embodiment according to the present invention.
Figure 6B:
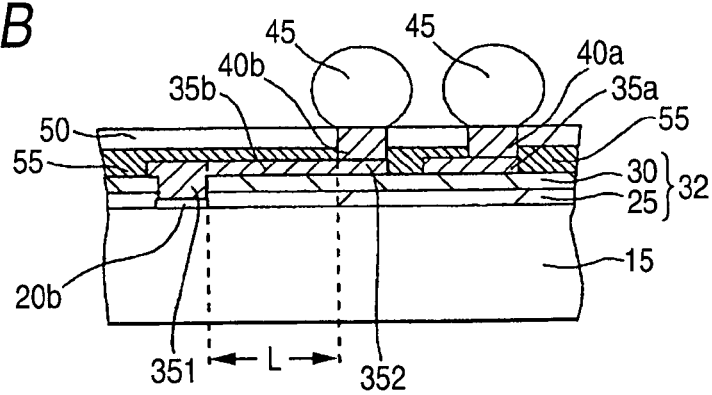
Figure 6C:
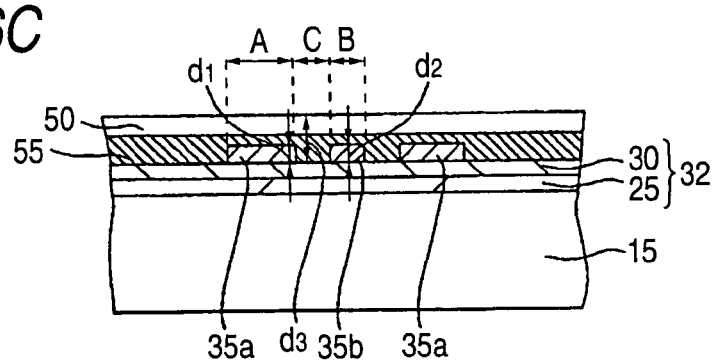

With reference to FIGS. 6A to 6C, a semiconductor device according to the fifth embodiment of the present invention will be described below.

The present embodiment is different from the fourth embodiment mainly in that, while the width of the GND wire 35a (=A) is set narrower, the spacing between the GND wire 35a and the signal line 35b (=C) is not narrowed and the GND wire 35a and the signal line 35b are embedded in a dielectric layer having a larger dielectric constant than that of the sealing membrane 50 (here, the epoxy resin with the dielectric constant $\in \cong 4$ [F/m]).

Therefore, according to the present embodiment, the GND wire 35a and the signal line 35b are embedded in a dielectric layer 55 made of a phenol resin (here, the dielectric constant $\in \cong 4.5$ to 5 [F/m]) (refer to FIGS. 6A to 6C).

By embedding the dielectric layer 55 between the GND wire 35a and the signal line 35b, the electromagnetic bond between the both is more enhanced as compared to the case that the epoxy resin 50 is embedded therebetween.

Accordingly, it is possible to decrease the characteristic impedance of the signal line 35b to be increased by narrowing the width of the GND wire 35a (=A) by means of this dielectric layer 55.

Further, according to the present embodiment, the dielectric layer 55 is provided so as to cover the full upper surface of the semiconductor chip 15 except for the post portion 40, and at least, the dielectric layer 55 may be provided so as to fill the gap between the GND wire 35a and the signal line 35b from one GND wire 35a sandwiching the signal line 35b across the other GND wire 35a, because the capacity between the GND wire 35a and the signal line 35b can be increased considerably at least by enhancing the electromagnetic bond between the both. As a result, it is possible to effectively decrease the characteristic impedance of the signal line 35b.

Therefore, for example, in the case of making the characteristic impedance of the signal line 35b about 50 [Ω], which is nearly equal to the impedance of the circuit element provided to the semiconductor chip 15, the characteristic impedance of the signal line 35b maybe set so that, for example, A=100 $\mu$m, B=40 $\mu$m, $d_1$=5 [$\mu$m], $d_2$=5 [$\mu$m], C=23 $\mu$m, $\rho$=1.67×10$^{-6}$ [$\Omega$cm (20° C.)], and $\in \cong$4.5 to 5 [F/m] and $d_3$=90 [$\mu$m] are established.

According to the above described setting conditions, it is possible to get rid of a mismatch between the signal line 35b and the circuit element provided to the semiconductor chip 15.

As being apparent from the above description, according to the present embodiment, it is possible to obtain the same advantage as that of the fourth embodiment.

[Sixth Embodiment]

Figure 7A:
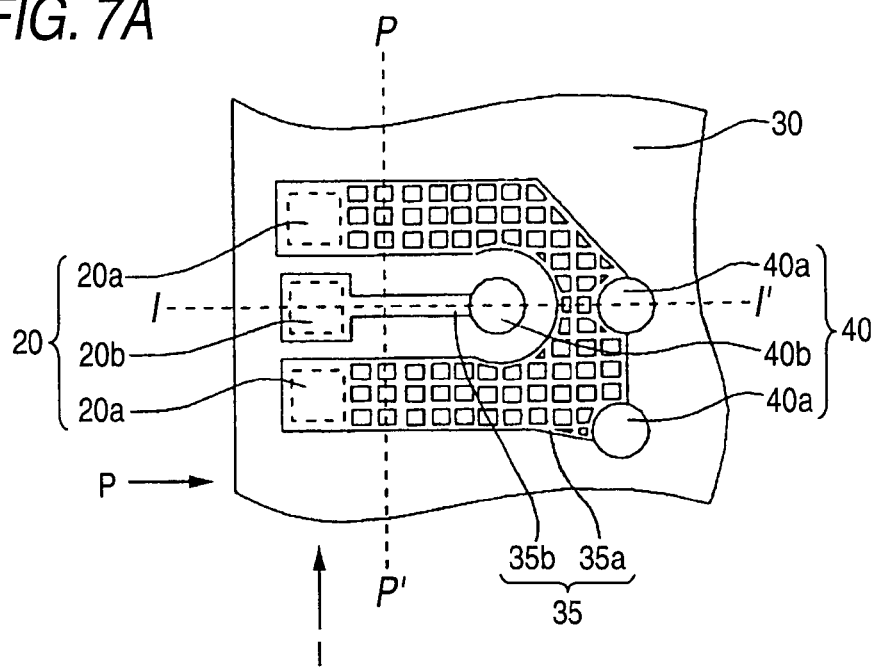
FIGS. 7A to 7C are a schematic plane view and a schematic cross sectional view for showing partially the semiconductor device of a sixth embodiment according to the present invention.
Figure 7B:
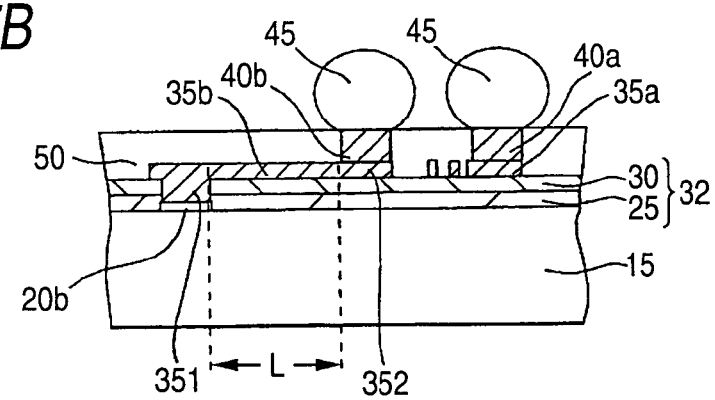
Figure 7C:
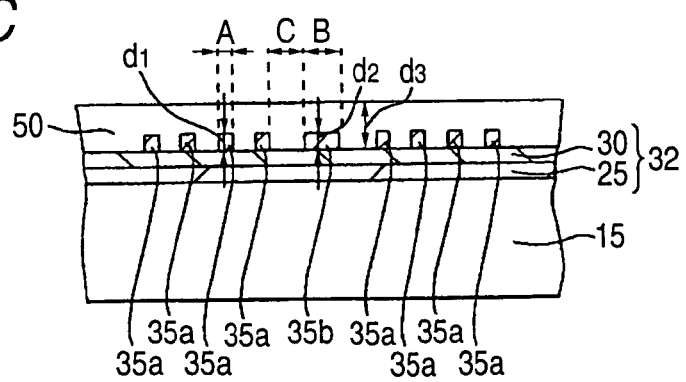

With reference to FIGS. 7A to 7C, a semiconductor device according to the sixth embodiment of the present invention will be described below.

The present embodiment is different from the third embodiment mainly in that the GND wire 35a is provided in a mesh.

As shown in FIG. 7A, when the GND wire 35a is formed in a mesh, an occupied area of the GND wire 35a itself is capable of being reduced, so that, as described above, the undesirable mutual interaction between the GND wire 35a serving as the rewiring layer and the integrated circuit provided to the semiconductor chip 15 is restrained.

Therefore, for example, in the case of making the characteristic impedance of the signal line 35b about 50 [$\Omega$], which is nearly equal to the impedance of the circuit element provided to the semiconductor chip 15, the characteristic impedance of the signal line 35b maybe set so that, for example, A=20 $\mu$m (this is a width of mesh), B=40 $\mu$m, $d_1$=5 [$\mu$m], $d_2$=5 [$\mu$m], C=22 [$\mu$m], $\rho$=1.67×10$^{-6}$ [$\Omega$cm (20° C.)], and $\in \cong$4 [F/m] and $d_3$=90 [$\mu$m] are established.

According to the above described setting conditions, it is possible to get rid of a mismatch between the signal line 35b and the circuit element provided to the semiconductor chip 15.

As being apparent from the above description, according to the present embodiment, it is possible to obtain the same advantage as that of the third embodiment.

Further, according to the present embodiment, when the GND wire 35a is formed in a mesh, the undesirable mutual interaction between the GND wire 35a serving as the rewiring layer and the integrated circuit provided to the semiconductor chip 15 is restrained. As a result, the semiconductor device having a higher reliability can be obtained.

[Seventh Embodiment]

Figure 8A:
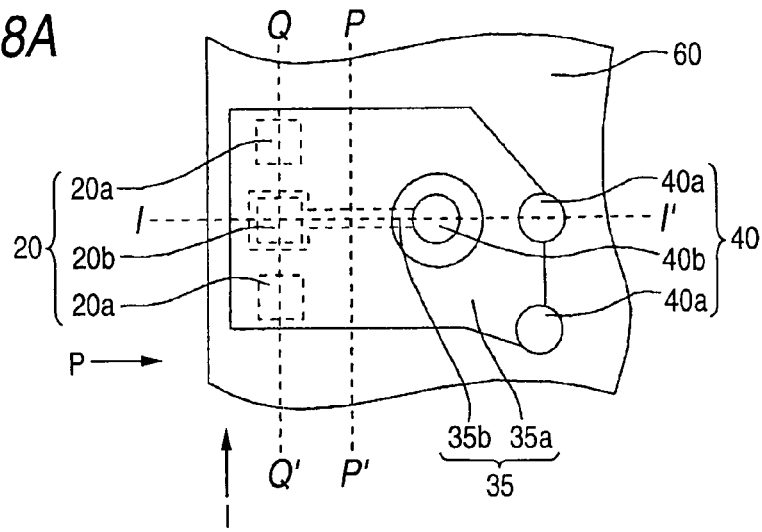
FIGS. 8A to 8D are a schematic plane view and a schematic cross sectional view for showing partially the semiconductor device of a seventh embodiment according to the present invention.
Figure 8B:
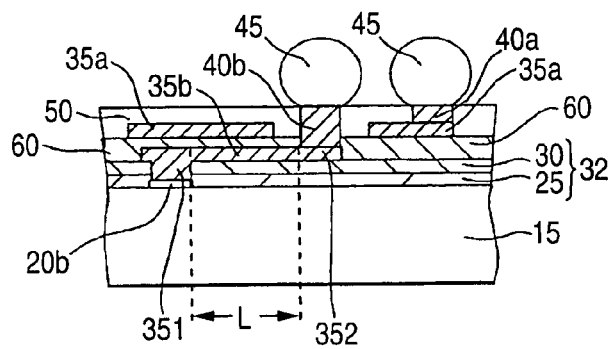
Figure 8C:
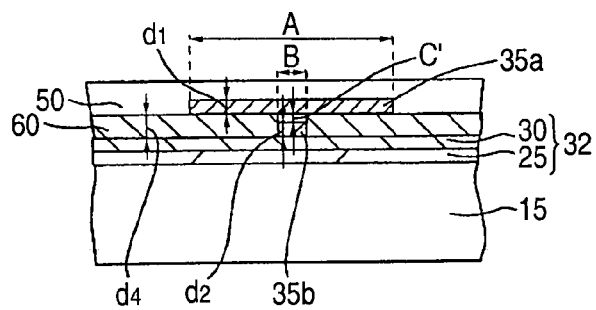
Figure 8D:
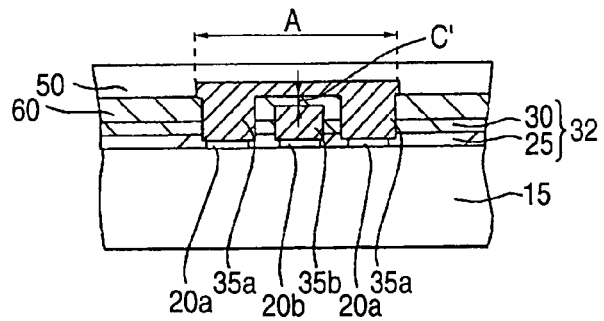
Figure 9A:
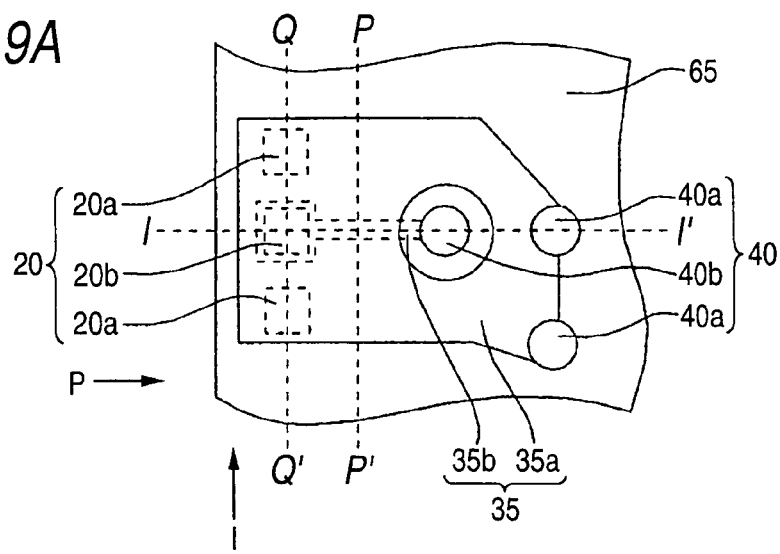
FIGS. 9A to 9D are a schematic plane view and a schematic cross sectional view for showing partially the semiconductor device of an eighth embodiment according to the present invention.
Figure 9B:
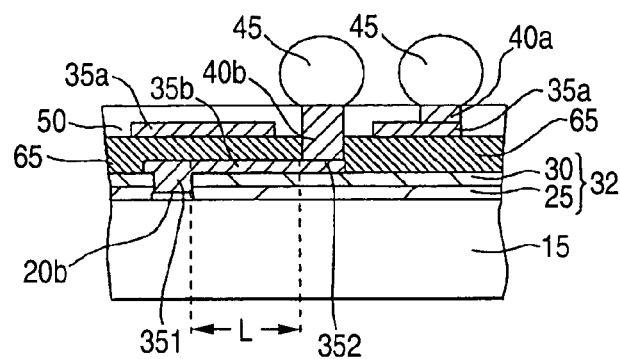
Figure 9C:
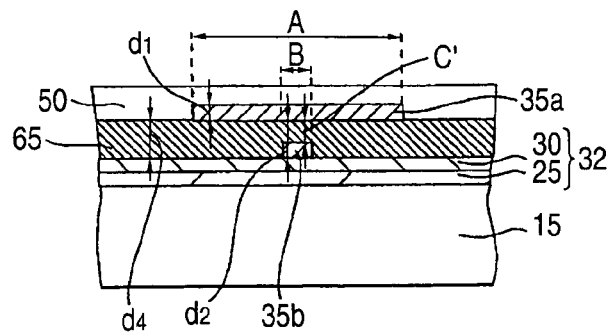
Figure 9D:
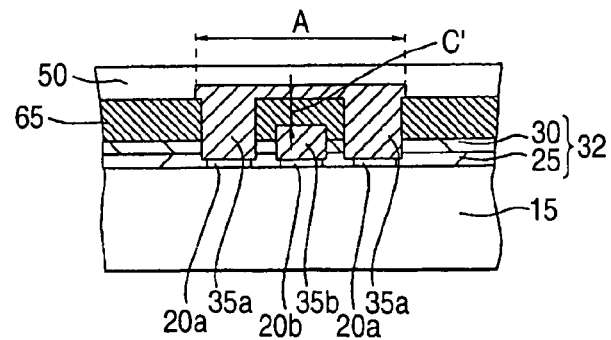

With reference to FIGS. 8A to 8D, a semiconductor device according to the seventh embodiment of the present invention will be described below. In FIG. 8D, a cut area (a cross section) to be acquired by cutting FIG. 8A along a broken line Q–Q' is seen from a narrow P direction in FIG. 8A.

Therefore, as shown in FIG. 8A, the wiring layer of the present embodiment has a micro strip line structure, in which the GND wire 35a is provided so as to cover the signal line 35, for example, via a dielectric layer (here, this dielectric layer is also referred to as a second insulating layer) 60, which is formed by the polyimide membrane.

More in detail, as shown in FIGS. 8A to 8D, on the semiconductor chip 15, a first insulating layer 32 and a second insulating layer 60 are mounted. Further, the second insulating layer 60 is mounted on this first insulating layer 32. An upper surface of a first electrode pad 20a is exposed from the first and second insulating layers (32, 60), and the second electrode pad 20b is exposed from the first insulating layer 32. Further, solder balls 45 formed on first and second post portions (40a, 40b) serving as an exterior terminal for connection to a mounting substrate are arranged with being shifted to the upper side of the semiconductor chip 15 from directly above the first and second electrode pads (20a, 20b), respectively. In addition, in this case, the second post portion 40b is mounted on a signal line 35b, which is placed on the first insulating layer 32. The side surface of this second post portion 40b is covered by the second insulating layer 60 and the resin seal 50. In addition, the first post portion 40a is mounted on the GND wire 35a placed on the second insulating layer 60. The side surface of this first post portion 40a is covered by the resin seal 50. Then, the first and second post portions (40a, 40b), as described above according to the first to sixth embodiments, is derived to the surface of the sealing membrane 50 to be connected to the solder ball 45 serving as the exterior terminal.

According to the present embodiment, the signal line 35b to be connected to the second electrode pad 20b is elongated on the protection membrane 30, namely, the first insulating layer 32 in a center direction of the semiconductor chip 15 to be electrically connected to the second post portion 40b.

On the other hand, the GND wire 35a to be connected to the first electrode pad 20a is elongated from the first electrode pad 20a to the other first electrode pad 20a in a vertical direction, and then, the GND wire 35a is continuously provided across the surface of a dielectric layer 60 covering the semiconductor chip 15 so as to expose the surface of the second post portion 40b and is electrically connected to the first post portion 40a.

In this way, in the micro strip line structure, which is provided so that the signal line 35b and the GND wire 35a are superposed with each other, as same as the coplanar line structure, the signal line 35b is provided with being sandwiched by the GND wires 35a, so that the electromagnetic bond between the GND wires 35a and the signal line 35b is enhanced. As a result, the capacity between the GND wires 35a and the signal line 35b is increased and the inductance of the signal line is decreased, so that it is possible to more decrease the characteristic impedance of the signal line 35b as compared to the conventional case.

Further, in the micro strip line structure, the GND wires 35a is placed with being more separated from the semiconductor chip 15 as compared to the coplanar line structure. Therefore, it is possible to restrain the undesirable mutual interaction between the GND wire 35a and the integrated circuit provided to the semiconductor chip 15 more effectively.

Further, according to the present embodiment, the second insulating layer, namely, the dielectric layer 60 is provided so as to cover the full upper surface of the semiconductor chip 15 except for the second post portion 40b, and at least, the second insulating layer may be provided so as to cover the signal line 35b, because the capacity between the GND wire 35a and the signal line 35b can be increased considerably at least by enhancing the electromagnetic bond between the both. As a result, it is possible to effectively decrease the characteristic impedance of the signal line 35b. In addition, as described according to the first embodiment, two GND wires 35a may be elongated along the signal line 35b at the opposite sides thereof and may be continuously provided so as to reach the surface of the dielectric layer 60.

More in detail, it is possible to match the characteristic impedance of this signal line 35b with the impedance of the circuit element provided to the semiconductor chip 15 mainly by adjusting a width of the GND wire 35a (represented by A in FIGS. 8C and 8D), a width of the signal line 35b (represented by B in FIG. 8C), a thickness of the GND wire 35a (represented by $d_1$ in FIG. 8C), a thickness of the signal line 35b (represented by $d_2$ in FIG. 8C), a vertical spacing between the GND wire 35a and the signal line 35b (represented by C' in FIGS. 8C and 8D), an electric resistivity ρ of the wiring layer 35 (the wiring layers 35a, 35b)(here, a copper (Cu) is used as a formation material of the wiring layer 35), a dielectric constant ∈ (here, the dielectric constant ∈ of a polyimide membrane 60 between the signal line 35b and the GND wire 35a, which has a considerable impact on the characteristic impedance of the signal line 35b) of a dielectric layer around a conductive part (the electrode pad 20, the post portion 40) on the semiconductor chip 15, and a thickness (represented by $d_4$ in FIG. 8C) of a dielectric layer around the conductive part (here, the polyimide membrane 60). Further, it is preferable that transmission efficiency is also considered when the formation material of the wiring layer 35 is a magnetic body.

Therefore, for example, in the case of making the characteristic impedance of the signal line 35b about 50 [Ω], which is nearly equal to the impedance of the circuit element provided to the semiconductor chip 15, the characteristic impedance of the signal line 35b maybe set so that, for example, A=400 μm, B=40 μm, $d_1$=5 [μm], $d_2$=5 [μm], C'=33 μm, ρ=1.67×10$^{-6}$ [Ωcm (20° C.)], and ∈≅3.3 [F/m] and $d_4$=38 [μm] are established.

According to the above described setting conditions, the characteristic impedance of the signal line 35b can be made about 50 [Ω]. Accordingly, it is possible to get rid of a mismatch of the impedance between the signal line 35b and the circuit element provided to the semiconductor chip 15.

As being apparent from the above description, according to the present embodiment, matching of the characteristic impedance of the signal line 35b and the impedance of the circuit element provided to the semiconductor chip 15 is realized. Therefore, the transmission of the high frequency signal can be effectively realized, so that it is possible to obtain a semiconductor device having the high frequency property, which is superior to the conventional one.

[Eighth Embodiment]

With reference to FIGS. 9A to 9D, a semiconductor device according to the eighth embodiment of the present invention will be described below.

The present embodiment is mainly different from the seventh embodiment in that, in place of the insulating layer 60 according to the seventh embodiment, a dielectric layer 65 having a higher dielectric constant than that of this insulating layer 60 is used as the second insulating layer.

According to the present embodiment, as the dielectric layer 65 in place of the dielectric layer 60 (the polyimide membrane (a dielectric constant ∈≅3.3 [F/m]) according to the seventh embodiment, a phenol resin (a dielectric constant ∈≅4.5 to 5 [F/m]) is provided.

Therefore, for example, in the case of making the characteristic impedance of the signal line 35b about 50 [Ω], which is nearly equal to the impedance of the circuit element provided to the semiconductor chip 15, the characteristic impedance of the signal line 35b maybe set so that, for example, A=400 μm, B=40 μm, $d_1$=5 [μm], $d_2$=5 [μm], C'=35 μm, ρ=1.67×10$^{-6}$ [Ωcm (20° C.)], and ∈≅4.5 to 5 [F/m] and $d_4$= 38 [μm] are established.

According to the above described setting conditions, it is possible to obtain the same advantage as that of the seventh embodiment.

Further, according to the present embodiment, the dielectric layer having the higher dielectric constant as compared to the seventh embodiment, namely, the second insulating layer 65 is disposed between the signal line 35b and the GND wire 35a.

As a result, it is possible to further enlarge the vertical spacing between the signal line 35b and the GND wire 35a (represented by C' in the drawing) as compared to the seventh embodiment.

Therefore, the undesirable mutual interaction between the GND wire 35a serving as the rewiring layer and the integrated circuit provided to the semiconductor chip 15 is restrained, so that the semiconductor device having a higher reliability can be obtained.

As described above, the present invention is not limited to the combination of the above described embodiments. Therefore, at the arbitrary preferable stage, it is possible to combine the preferable conditions and apply the present invention.

Further, by providing this signal line 35b so that the signal line length of the signal line 35b is not more than quarter of the effective wave length of the operational frequency of the semiconductor chip, the attenuation of the transmission signal arising from the reflection or the like is capable of being effectively restrained.

As being apparent from the above description, according to the semiconductor device of the present embodiment, matching of the characteristic impedance of the signal line and the impedance of the circuit element is realized more effectively as compared to the conventional case.

Therefore, it is possible to realize the transmission of the high frequency signal effectively and the semiconductor device having the high frequency property, which is superior to the conventional one, may be acquired.

What is claimed is:

1. A semiconductor device, comprising:
   a semiconductor chip having a main surface, wherein the main surface has a first area, a second area located outside and adjacently to the first area and a third area located outside and adjacently to the second area;
   first, second and third electrode pads formed on the main surface in the third area, wherein the first, second and third electrode pads are aligned with each other and wherein the second electrode pad is located between the first and third electrode pads;
   an insulating layer formed on the main surface in the first, second and third areas, wherein the first, second and third electrode pads are exposed from the insulating layer;
   a first exterior terminal formed above the insulating layer in the first area;
   a second exterior terminal formed above the insulating layer in the second area;
   a third exterior terminal formed above the insulating layer in the first area;
   a first conductive pattern formed above the insulating layer, so that the first conductive pattern electrically connects the first electrode pad and the first exterior terminal;
   a second conductive pattern formed above the insulating layer, so that the second conductive pattern electrically connects the second electrode pad and the second exterior terminal; and
   a third conductive pattern formed above the insulating layer, so that the third conductive pattern electrically connects the third electrode pad and the third exterior terminal,
   wherein the first and third conductive patterns are longer than the second conductive pattern, the second exterior terminal is sandwiched between the first and third conductive patterns, and a same predetermined potential is applied to the first and third electrode pads.

2. The semiconductor device according to claim 1, wherein each of the first, second and third exterior terminals has a post and a solder ball.

3. The semiconductor device according to claim 1, wherein characteristic impedance of the first, second and third conductive patterns are decreased.

4. The semiconductor device according to claim 1, wherein a width of the second conductive pattern is narrower than a width of each of the first and third conductive patterns.

5. The semiconductor device according to claim 1, wherein the first and third conductive patterns are connected together at one end.

6. The semiconductor device according to claim 1, wherein the first, second and third conductive patterns are embedded by a dielectric layer.

7. The semiconductor device according to claim 6, wherein the dielectric layer is formed of epoxy resin.

8. The semiconductor device according to claim 1, wherein the first and third conductive patterns have a plurality of square openings.

9. The semiconductor device according to claim 1, wherein the first exterior terminal is formed on a distal end of the first conductive pattern, the second exterior terminal is formed on a distal end of the second conductive pattern, and the third exterior terminal is formed on a distal end of the third conductive pattern.

10. The semiconductor device according to claim 1, wherein the first, second and third conductive patterns are made of Cu.

11. The semiconductor device according to claim 1, wherein the first, second and third exterior terminals are solder balls.

12. The semiconductor device according to claim 1, wherein the insulating layer comprises a passivation film, and a protection film formed on the passivation film.

13. The semiconductor device according to claim 12, wherein the passivation film is a silicon oxide film, and the protection film is made of polyimide resin.

14. The semiconductor device according to claim 1, further comprising:
a resin formed over the insulating layer, the first, second and third electrode pads and the first, second and third conductive patterns, so that the first, second and third exterior terminals are exposed from the resin.

15. The semiconductor device according to claim 14, wherein the resin is an epoxy resin.

16. The semiconductor device according to claim 1, further comprising:
a first post portion being located between and electrically connecting the first conductive pattern and the first exterior terminal;
a second post portion being located between and electrically connecting the second conductive pattern and the second exterior terminal; and
a third post portion being located between and electrically connecting the third conductive pattern and the third exterior terminal.

17. A semiconductor device comprising:
a semiconductor chip having a main surface, wherein the main surface has a first area and a second area, and wherein the first area is located outside of the second area;
first, second and third electrode pads formed on the main surface in the first area, wherein the first, second and third electrode pads are aligned with each other and wherein the second electrode pad is located between the first and third electrode pads;
an insulating layer formed on the main surface in the first and second areas, wherein the first, second and third electrode pads are exposed from the insulating layer;
first, second and third exterior terminals formed above the insulating layer in the second area;
a first conductive pattern formed above the insulating layer, so that the first conductive pattern electrically connects the first electrode pad and the first exterior terminal;
a second conductive pattern formed above the insulating layer, so that the second conductive pattern electrically connects the second electrode pad and the second exterior terminal; and
a third conductive pattern formed above the insulating layer, so that the third conductive pattern electrically connects the third electrode pad and the third exterior terminal,
wherein the first, second and third conductive patterns each have a same thickness, and
wherein the first and third conductive patterns are longer than the second conductive pattern, the second exterior terminal is sandwiched between the first and third conductive patterns, and a same predetermined potential is applied to the first and third electrode pads.

18. The semiconductor device according to claim 17, wherein widths of the first and third conductive patterns are respectively five times greater than a width of the second conductive pattern.

19. The semiconductor device according to claim 17, wherein the first exterior terminal is formed on a distal end of the first conductive pattern, the second exterior terminal is formed on a distal end of the second conductive pattern, and the third exterior terminal is formed on a distal end of the third conductive pattern.

20. The semiconductor device according to claim 18, wherein the first, second and third conductive patterns are made of Cu.

21. The semiconductor device according to claim 17, wherein the first, second and third exterior terminals are solder balls.

22. The semiconductor device according to claim 17, wherein the insulating layer comprises a passivation film, and a protection film formed on the passivation film.

23. The semiconductor device according to claim 22, wherein the passivation film is a silicon oxide film, and the protection film is made of polyimide resin.

24. The semiconductor device according to claim 17, further comprising:
a resin formed over the insulating layer, the first, second and third electrode pads and the first, second and third conductive patterns, so that the first, second and third exterior terminals are exposed from the resin.

25. The semiconductor device according to claim 24, wherein the resin is an epoxy resin.

26. The semiconductor device according to claim 17, further comprising:
a first post portion being located between and electrically connecting the first conductive pattern and the first exterior terminal;
a second post portion being located between and electrically connecting the second conductive pattern and the second exterior terminal;
a third post portion being located between and electrically connecting the third conductive pattern and the third exterior terminal.

* * * * *